United States Patent

Choi

Patent Number: 5,928,378
Date of Patent: Jul. 27, 1999

[54] ADD-COMPARE-SELECT PROCESSOR IN VITERBI DECODER

[75] Inventor: Young-Bae Choi, Seoul, Rep. of Korea

[73] Assignee: Daewoo Electronics Co., Ltd., Seoul, Rep. of Korea

[21] Appl. No.: 08/916,665

[22] Filed: Aug. 22, 1997

[30] Foreign Application Priority Data

Aug. 23, 1996 [KR] Rep. of Korea .................... 96-35229

[51] Int. Cl.$^6$ ............................................. G06F 11/10
[52] U.S. Cl. ................................. 714/795; 375/341
[58] Field of Search .................. 371/43.7, 43.4, 371/43.6, 43.8; 375/341

[56] References Cited

U.S. PATENT DOCUMENTS 5,291,499  3/1994  Behrens et al. ........................ 371/43
5,530,707  6/1996  Lin ............................................ 371/43

Primary Examiner—Albert DeCady
Assistant Examiner—Samuel Lin
Attorney, Agent, or Firm—Pillsbury Madison & Sutro LLP

[57] ABSTRACT

An add/compare/select (ACS) processor in a Viterbi decoder is disclosed. The ACS processor comprises a plurality of processing elements for receiving two path metrics and two branch metrics, comparing each added values, and outputting two decision bits and two state metrics according to the compared result; a grouping unit for grouping N number of processing elements for corresponding N number of states into K number of units using the same state metrics and the same branch metrics; a multiplexer for multiplexing L (L=2K) number of path metrics provided from the grouping unit into two path metrics according to a predetermined clock signal, and outputting them to a corresponding processing element; a first demultiplexer for receiving two decision bits outputted from the corresponding processing element, and demultiplexing them into L number of decision bits according to the clock signal; and a second demultiplexer for receiving two state metrics outputted from the corresponding processing element, and demultiplexing them into L number of state metrics according to the clock signal. Hence, the size of the hardware for ACS processor significantly decreases by having the above structure.

5 Claims, 4 Drawing Sheets

ADD-COMPARE-SELECT PROCESSOR IN VITERBI DECODER

BACKGROUND OF THE INVENTION

1. Field of the Invention

The present invention relates to an add/compare/select (ACS) processor using the same in Viterbi decoder, and more particularly to an ACS processor for performing add/compare/select process with respect to a plurality of states in one processing element by grouping N number of processing elements for corresponding N number of states into a predetermined processing element units using the same branch metric and state metric.

2. Description of the Prior Art

In general, a Viterbi algorithm is used as a practical and efficient method for a maximum-likelihood decoding of convolutional codes. In the Viterbi algorithm, path distances of two different paths which meet at an arbitrary state are compared by using a trellis diagram. By the comparison, the path with a shorter distance, namely a path of the lowest error generation probability is selected as a survivor path. A Viterbi decoder using the Viterbi algorithm is, for example, used for error correction in satellite communication systems, since the decoder has a high random error correction capability.

Referring to FIGS. 1A and 1B, the Viterbi algorithm will be described in detail. FIG. 1A shows a trellis diagram in which the number of node and state is 2. Its vertical and horizontal directions represent the state $S_i$ (i=1, 2) and time (t/T: here, 1/T represents a transmission rate), respectively, and $S_{i,k}$ represents (i)th state at time k. A Finite State Machine selects an arbitrary path through the trellis diagram illustrated in FIG. 1A, and calculates a branch metric $\lambda$ for a time interval (k, k+1) according to a transition of the observed state. Namely, by the trellis diagram, the states $(S_{1,k}, S_{2,k})$ at the time k are connected with the states $(S_{1,k+1}, S_{2,k+1})$ at the time k+1 by each branch for the time interval (k, k+1). During Viterbi decoding, a distance between the codes at the branch corresponding to received signals, namely the branch metric, is calculated. The branch metric becomes a hamming distance for a hard decision decoding, and an Euclidean distance for a soft decision decoding.

By using the calculated branch metric, a new path metric for each node at the time k+1 is calculated according to a path metric $\gamma$ at time k and the branch metric $\lambda$ at the time interval (k, k+1). This calculation will be described in detail by referring to FIG. 1B.

In FIG. 1B, the nodes $S_{1,k}, S_{2,k}$ at time k have the path metrics $\gamma_{1,k}, \gamma_{2,k}$, which are the accumulation of its branch metrics, respectively. When the branch metrics for the time interval (k, k+1) are $\lambda_{11,k}, \lambda_{12,k}, \lambda_{21,k}, \lambda_{22,k}$, new path metrics $\gamma_{1, k+1}, \gamma_{2, k+1}$ of the nodes $S_{1,k+1}, S_{2,k+1}$ at time k+1 are obtained by the following expression 1.

Expression 1.

$\gamma_{1, k+1} = \max[\lambda_{11,k}+\gamma_{1,k}, \lambda_{12,k}+\gamma_{2,k}]$ $\gamma_{2, k+1} = \max[\lambda_{21,k}+\gamma_{1,k}, \lambda_{22,k}+\gamma_{2,k}]$ Namely, a plurality of paths with a variation of states at time k lead to the node at time k+1, and utilizing a probability information of a branch metric, the path metric is determined. The process for calculating the path metric is performed recursively for each time k to determine a final survivor path.

When the survivor paths are traced back, the paths merge at an arbitrary point in time with high probability, as shown in FIG. 1B. The number of time steps which merge at the point with high probability is a survivor depth, and it determines the latency of the Viterbi decoding. Namely, when the path metrics $\gamma$ are updated by the expression 1 at each node, they retain the states of the corresponding paths prior to reaching the survivor depth. Accordingly, the variations of the states prior to the survivor depth, which are obtained by the trace back, are outputted as a Viterbi-decoded data.

FIG. 2 shows a block diagram of a conventional Viterbi decoder. The Viterbi decoder comprises a branch metric generator 100, an ACS unit 200, and a survivor memory 300.

In FIG. 2, the branch metric generator 100 receives a convolutionally-coded data, and calculates a branch metric $\lambda_{ij, k}$, which is a distance between codes on each branch corresponding to a received signal. At this time, the complexity of the branch metric generation unit 100 is directly related to the length of received code word. As the number of bit comprising code words increases, the more complex circuit is required. For example, when the code words are composed of 2-bits, the number of comparison code words needed for comparing received code words of 2-bits are $2^2$ or 4. If, the code words are composed of 3-bits, the number of comparison code words needed for comparing received code words of 3-bits are $2^3$ or 8. Additionally, the branch metric values calculated with respect to the longer code words are larger. Consequently, as the memory capacity for storing corresponding branch metrics increases as much as the increase in the branch metric values and the number of comparison code words, it leads to the structural complexity of ACS unit 200.

The ACS unit 200 receives the branch metrics from the branch metric generator 100, adds them to the previous path metric and determines a multitude of candidate paths. The ACS unit 200 then compares the multitude of candidate path metric values, and selects a path having the shortest path metric, and outputs the newly selected path metric and the compared result, namely the decision bit. ACS unit 200 updates the path metric by using the branch metric obtained from the branch metric generator 100 at each decoding cycle, and outputs the decision bit of N-bits to the survivor memory 300. Accordingly, when trellis diagram comprises total of N number of states, N-bits are obtained from each decoding cycle.

The survivor memory 300 stores the decision bit obtained from the ACS unit 200, recovers the original information sequence by using the decision bit, and outputs it as a Viterbi-decoded data.

FIG. 3 shows a block diagram of a processing element 310 of the ACS unit 200 illustrated in FIG. 2. The processing element 310 comprises largely a first processor 320 and a second processor 340. Here, the first processor 320 comprises a first adder 322, a second adder 324, a first comparator 326, and a first selector 328. The second processor 340 comprises a third adder 342, a fourth adder 344, a second comparator 346, and a second selector 348.

In FIG. 3, $\gamma_X$ and $\gamma_Y$ represent path metrics inputted into the processing element 310, respectively, and here the path metric of 6-bits is taken as an example to show the operation of the processing elements. The path metric $\gamma_X$ is inputted into the first adder 322 of the first processor 320 and the third adder 342 of the second processor 340. The path metric $\gamma_Y$ is inputted into the second adder 324 of the first processor 320 and the fourth adder 344 of the second processor 340. The branch metrics $\lambda_X$ and $\lambda_Y$ are provided from the branch metric generator 100 in FIG. 2, and the branch metric of 4-bits is taken as an example here. The branch metric $\lambda_X$ is inputted into the first adder 322 of the first processor 320 and the fourth adder 344 of the second processor 340. The branch metric $\lambda_Y$ is inputted into the second adder 324 of the first processor 320 and the third adder 342 of the second processor 340. The first and second decision bits outputted from the first and second comparators 326 and 346 of the first and second processors 320 and 340, respectively, are provided to the survivor memory 300 in FIG. 2.

Referring to FIG. 3, an operation of the processing element 310 of the ACS unit 200 will be described in detail.

In view of the first processor 320, the first adder 322 adds the path metric $\gamma_X$ to the branch metric $\lambda_X$, and outputs the added value to the first comparator 326 and the first selector 328, respectively. The second adder 324 adds the path metric $\gamma_Y$ to the branch metric $\lambda_Y$, and outputs the added value to the first comparator 326 and the first selector 328, respectively.

The first comparator 326 compares the added value from the first adder 322 to the added value from the second adder 324, and outputs the compared result, namely a first decision bit to the first selector 328 as a selection signal to the survivor memory 300 in FIG. 2. For example, when the added value from the first adder 322 is larger than the added value from the second adder 324, the first comparator 326 outputs the first decision bit "0". When the added value from the first adder 322 is smaller than the added value from the second adder 324, the first decision bit "1" is outputted.

The first selector 328 selectively outputs the added value from the first adder 322 or the added value from the second adder 324 according to the selection signal. Namely, the first selector 328 selects the added value from the second adder 324 to output it as the state metric when the first decision bit is "0", whereas it selects the added value from the first adder 322 to output it as the state metric when the first decision bit is "1".

In view of the second processor 340, the third adder 342 adds the path metric $\gamma_X$ to branch metric $\lambda_Y$, and outputs the added value to the second comparator 346 and the second selector 348, respectively. The fourth adder 344 adds the path metric $\gamma_Y$ to branch metric $\lambda_X$, and outputs the added value to the second comparator 346 and the second selector 348, respectively.

The second comparator 346 compares the added value from the third adder 342 to the added value from the fourth adder 344, and outputs the compared result, namely the second decision bit to the second selector 348 as a selection signal and the survivor memory 300 in FIG. 2, respectively. For example, when the added value from the third adder 342 is larger than the added value from the fourth adder 344, the second comparator 346 outputs the second decision bit "0". When the added value from the third adder 342 is smaller than the added value from the fourth adder 344, the second decision bit "1" is outputted.

The second selector 348 selectively outputs the added value from the third adder 342 or the added value from the fourth adder 344 according to the selection signal. Namely, the second selector 348 selects the added value from the fourth adder 344 to output it as the state metric when the second decision bit is "0", whereas it selects the added value from the third adder 342 to output it as the state metric when the second decision bit is "1".

It is possible to combine, by grouping, the two processing elements using to same state metric into an one processing element as shown in FIG. 3. Namely, one processing element performs add/compare/select processing for two states. Hence, in case of 64 states, ACS processor needs 32 processing elements PE0 through PE31.

The above ACS processor is an improved version to the ACS processor which processes one state in one processing element, however, it leaves much to be desired. Recently, as the technology for Application Specific Integrated Circuits (ASIC) has rapidly advanced, there is a need to decrease the size of the hardware when designing ASIC by processing at least more than two states in one processing element.

SUMMARY OF THE INVENTION

In view of the foregoing, it is an object of the present invention to provide an ACS processor for performing add/compare/select processing with regard to a plurality of states in one processing element and improving area-efficiency of ACS processor in ASIC design.

In order to achieve the above object, the present invention provides the ACS processor in a Viterbi decoder for performing a maximum likelihood decoding of convolutional codes, the ACS processor comprising:

N number of processing elements for receiving two path metrics and two branch metrics, comparing each added values, and outputting two decision bits and two state metrics according to a compared result;

a grouping unit for grouping N number of processing elements for corresponding N number of states into processing elements of K number of units using the same state metrics and the same branch metrics;

a multiplexer for multiplexing L (L=2K) number of path metrics provided from the grouped result into two path metrics according to a predetermined clock signal, and outputting them to a corresponding processing element of the N number of processing elements;

a first demultiplexer for receiving two decision bits obtained from the corresponding processing element, and demultiplexing them into L number of decision bits according to the clock signal; and a second demultiplexer for receiving two state metrics obtained from the corresponding processing element, and demultiplexing them into L number of state metrics according to the clock signal.

BRIEF DESCRIPTION OF THE DRAWINGS

The above and other objects, features, and advantages of the present invention will be apparent from the following detailed description of the preferred embodiments of the invention in conjunction with the accompanying drawings, in which.

DESCRIPTION OF THE PREFERRED EMBODIMENT

Reference will now be made in detail to the present invention, examples of which are illustrated in the accompanying drawings. Wherever possible, the same reference numbers will be used throughout the drawings to refer to the same or like parts.

Figure 4:
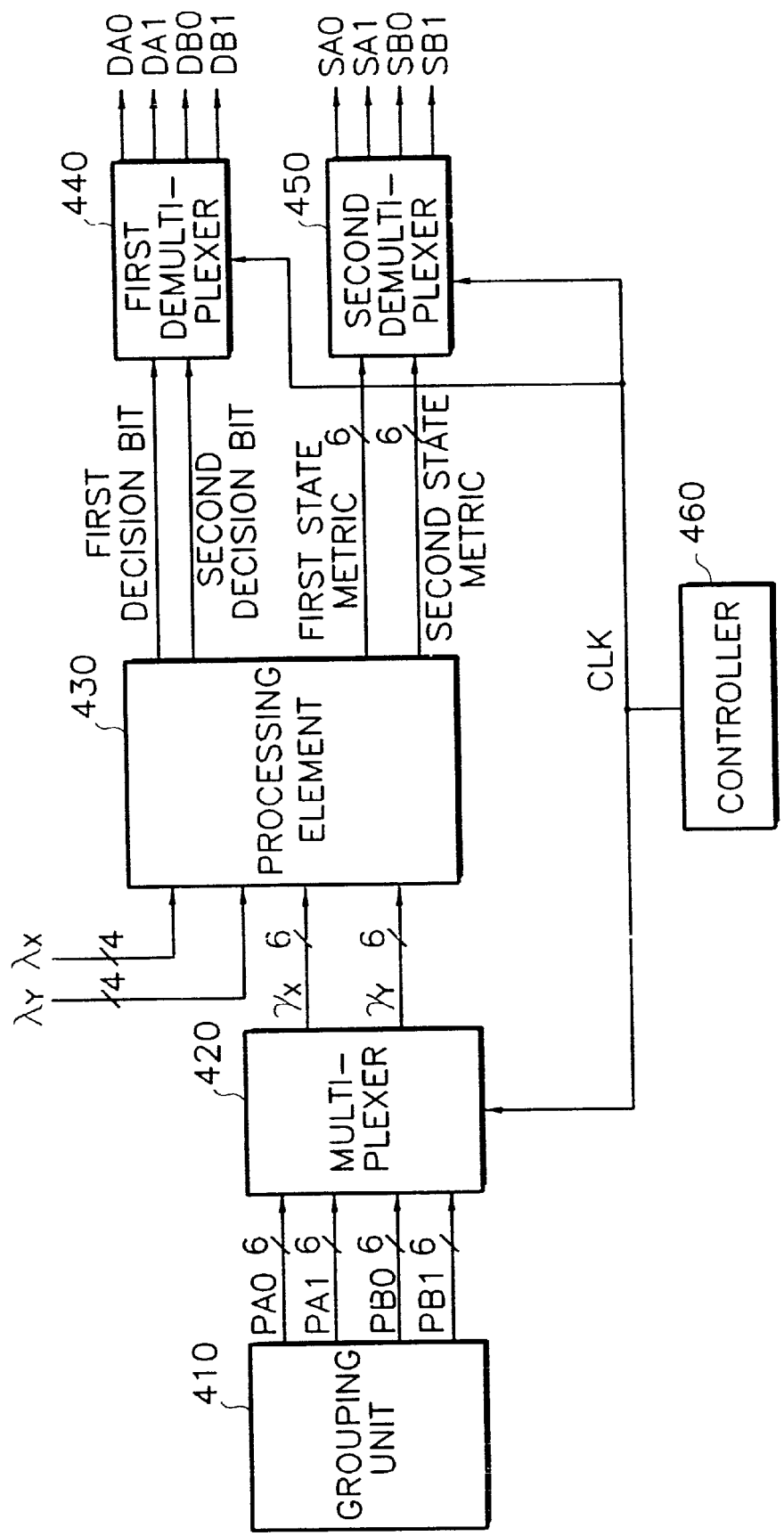
FIG. 4 is a block diagram illustrating an ACS processor of a Viterbi decoder in accordance with a preferred embodiment of the present invention.

FIG. 4 is a block diagram of an ACS processor in accordance with a preferred embodiment of the present invention. The ACS processor comprises a multitude of processing elements, however, for convenience's sake, only one processing element will be described in detail.

The ACS processor comprises a grouping unit 410, a multiplexer 420, a processing element 430, a first demultiplexer 440, a second demultiplexer 450, and a controller 460. The path metrics PA0, PA1, PB0, and PB1, inputted into the multiplexer 420, are of 6-bits units. The path metrics $\gamma_X$ and $\gamma_Y$ outputted from the multiplexer 420 are of 6-bits units. The branch metrics $\lambda_X$ and $\lambda_Y$ inputted to the processing element 430 are of 4-bits units. The decision bits DA0, DA1, DB0, and DB1 are outputted from the first demultiplexer 440. The state metrics SA0, SA1, SB0, and SB1 outputted from the second demultiplexer 450 are of 6-bits units.

In FIG. 4, the grouping unit 410 groups N number of processing elements for N number of states into processing elements of predetermined units using the same state metrics and the same branch metrics. Here, in case of 64 states, a grouping unit comprising four states are processed in one processing element. Among the grouped processing elements, ones having co-relationship are placed and routed closely in ASIC.

The multiplexer 420 receives four path metrics PA0, PA1, PB0, and PB1, and selectively outputs the two path metrics $\gamma_X$, $\gamma_Y$=PA0, PA1 or PB0, PB1 to the processing element 430 according to the clock signal.

Figure 1A:
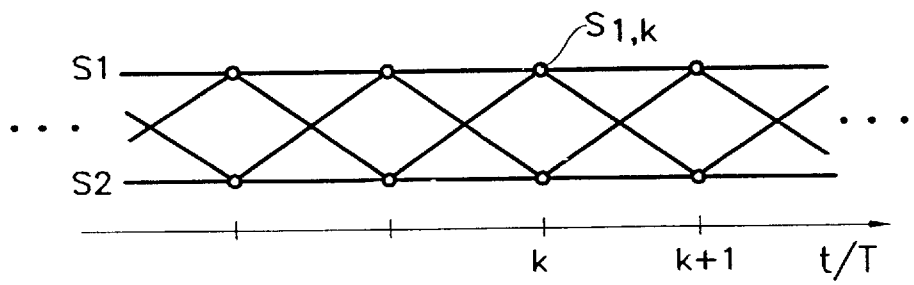
FIGS. 1A and 1B are trellis diagrams used in a Viterbi decoding algorithm.
Figure 1B:
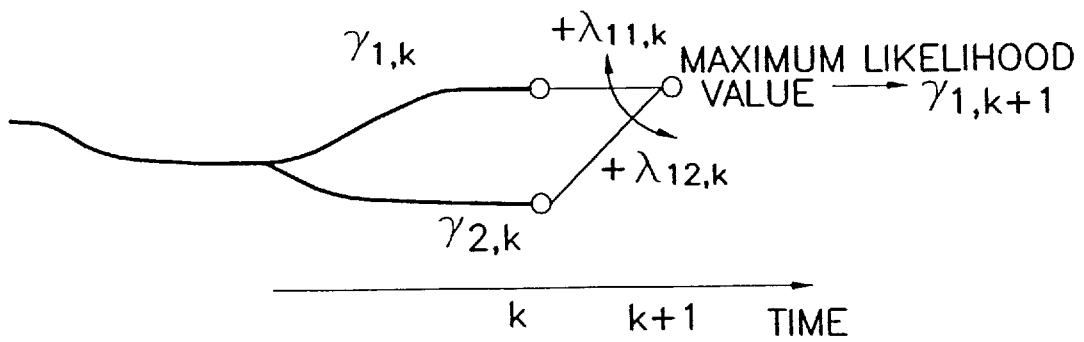
Figure 3:
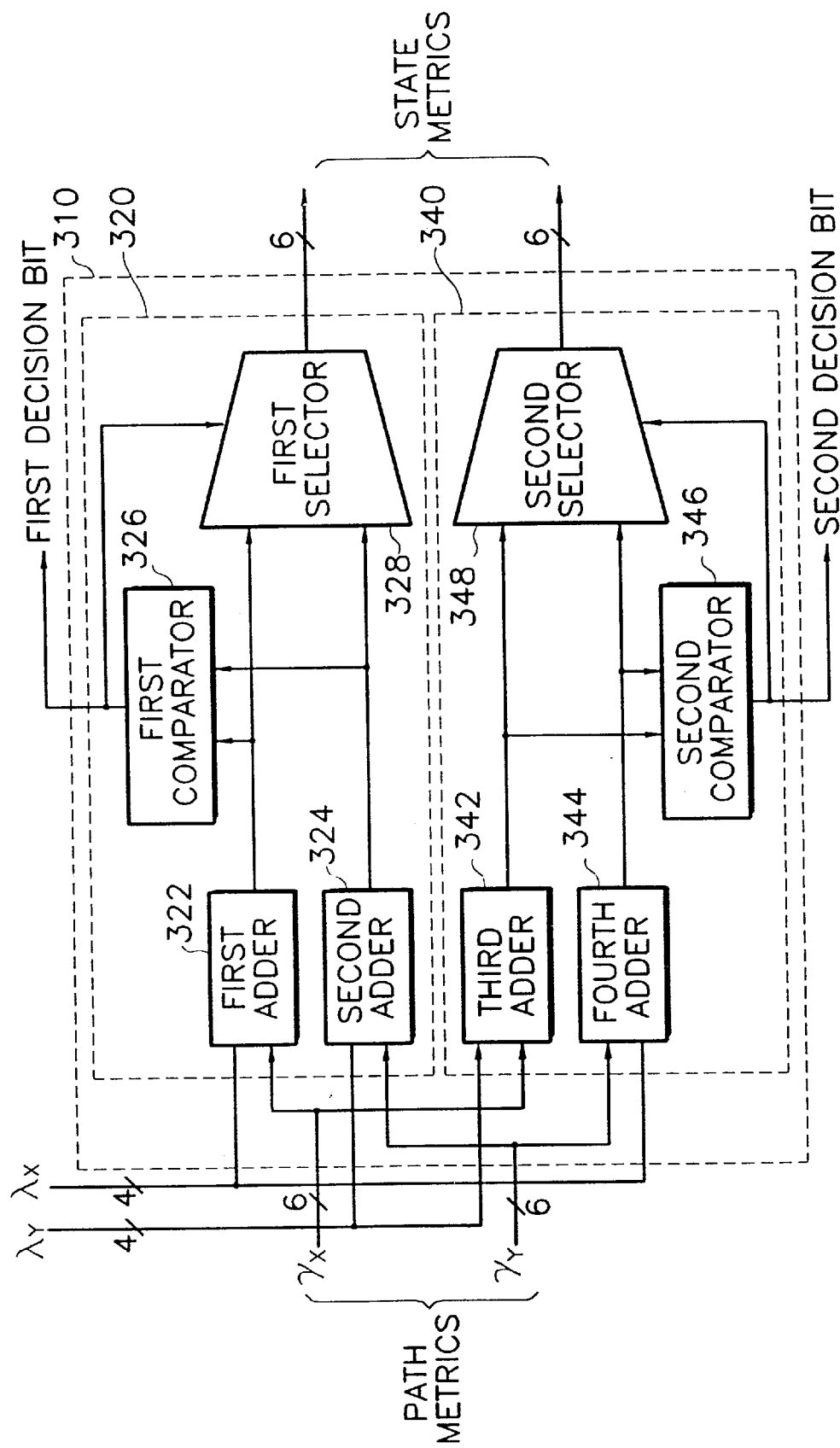
FIG. 3 is a block diagram illustrating a processing element in an ACS processor of FIG. 2.

The processing element 430 is the same type of the conventional processing element 310 illustrated in FIG. 3. The processing element 430 receives two path metrics $\gamma_X$ and $\gamma_Y$ from the multiplexer 420, and two branch metrics $\lambda_X$ and $\lambda_Y$ from the branch metric generator 100 of FIG. 1, and outputs two decision bits comprising first and second decision bits, and two state metrics. The detailed description about this process is fully elaborated in the background of the invention section.

The first demultiplexer 440 receives two decision bits, the first and second decision bits from the processing element 430, demultiplexes and outputs them in four decision bits DA0, DA1, DB0, and DB1 according to the clock signal.

The second demultiplexer 450 receives two state metrics from the processing element 430, demultiplexes and outputs them in four state metrics SA0, SA1, SB0, and SB1 according to the clock signal.

Referring to FIGS. 3 and 4, an operation and effects of the ACS processor of the present invention will be described in detail.

For processing 64 states, the ACS processor comprising processing elements of the structure like FIG. 3 can be constructed with ASIC by the following program. A program language used in the program is Very High Definition Language (VHDL).

```
component T_ACS52
    port(
        bmet_x,bmet_y : in, std_logic_vector(Bit_Branch-1 downto 0):
        pmet_x,pmet_y : in, std_logic_vector(Bit_State-1 downto 0):
        over_flag : out, std_logic;         ---overflow indicator a,b
        decision_a,decision_b : out, std_logic;        ---decision bit
        smet_a,smet_b : out std_logic_vector(Bit_State-1 downto 0)
    );
end component;
begin
    PE_ASSIGN : process(bmet0,bmet1,bmet2,bmet3,pmet)
---begin
PE0 : T_ACS52
    port Map(bmet0,bmet3,pmet(0),pmet(1),
        over_flag(0),decision_a(0),decision_b(0),smet(0),smet(32));
PE1 : T_ACS52
    port Map(bmet1,bmet2,pmet(2),pmet(3),
        over_flag(1),decision_a(1),decision_b(1),smet(1),smet(33));
PE2 : T_ACS52
    port Map(bmet0,bmet3,pmet(4),pmet(5),
        over_flag(2),decision_a(2),decision_b(2),smet(2),smet(34));
PE3 : T_ACS52
    port Map(bmet1,bmet2,pmet(6),pmet(7),
        over_flag(3),decision_a(3),decision_b(3),smet(3),smet(35));
PE4 : T_ACS52
    port Map(bmet3,bmet0,pmet(8),pmet(9),
        over_flag(4),decision_a(4),decision_b(4),smet(4),smet(36));
PE5 : T_ACS52
    port Map(bmet2,bmet1,pmet(10),pmet(11),
        over_flag(5),decision_a(5),decision_b(5),smet(5),smet(37));
PE6 : T_ACS52
    port Map(bmet3,bmet0,pmet(12),pmet(13),
        over_flag(6),decision_a(6),decision_b(6),smet(6),smet(38));
PE7 : T_ACS52
    port Map(bmet2,bmet1,pmet(14),pmet(15),
        over_flag(7),decision_a(7),decision_b(7),smet(7),smet(39));
PE8 : T_ACS52
    port Map(bmet3,bmet0,pmet(16),pmet(17),
        over_flag(8),decision_a(8),decision_b(8),smet(8),smet(40));
PE9 : T_ACS52
    port Map(bmet2,bmet1,pmet(18),pmet(19),
        over_flag(9),decision_a(9),decision_b(9),smet(9),smet(41));
PE10 : T_ACS52
    port Map(bmet3,bmet0,pmet(20),pmet(21),
        over_flag(10),decision_a(10),decision_b(10),smet(10),smet(42));
PE11 : T_ACS52
    port Map(bmet2,bmet1,pmet(22),pmet(23),
        over_flag(11),decision_a(11),decision_b(11),smet(11),smet(43));
PE12 : T_ACS52
    port Map(bmet0,bmet3,pmet(24),pmet(25),
        over_flag(12),decision_a(12),decision_b(12),smet(12),smet(44));
PE13 : T_ACS52
    port Map(bmet1,bmet2,pmet(26),pmet(27),
        over_flag(13),decision_a(13),decision_b(13),smet(13),smet(45));
PE14 : T_ACS52
    port Map(bmet0,bmet3,pmet(28),pmet(29),
        over_flag(14),decision_a(14),decision_b(14),smet(14),smet(46));
PE15 : T_ACS52
    port Map(bmet1,bmet2,pmet(30),pmet(31),
        over_flag(15),decision_a(15),decision_b(15),smet(15),smet(47));
PE16 : T_ACS52
    port Map(bmet2,bmet1,pmet(32),pmet(33),
        over_flag(16),decision_a(16),decision_b(16),smet(16),smet(48));
PE17 : T_ACS52
    port Map(bmet3,bmet0,pmet(34),pmet(35),
        over_flag(17),decision_a(17),decision_b(17),smet(17),smet(49));
PE18 : T_ACS52
    port Map(bmet2,bmet1,pmet(36),pmet(37),
        over_flag(18),decision_a(18),decision_b(18),smet(18),smet(50));
PE19 : T_ACS52
    port Map(bmet3,bmet0,pmet(38),pmet(39),
        over_flag(19),decision_a(19),decision_b(19),smet(19),smet(51));
PE20 : T_ACS52
    port Map(bmet1,bmet2,pmet(40),pmet(41),
        over_flag(20),decision_a(20),decision_b(20),smet(20),smet(52));
PE21 : T_ACS52
    port Map(bmet0,bmet3,pmet(42),pmet(43),
        over_flag(21),decision_a(21),decision_b(21),smet(21),smet(53));
PE22 : T_ACS52
    port Map(bmet1,bmet2,pmet(44),pmet(45),
        over_flag(22),decision_a(22),decision_b(22),smet(22),smet(54));
PE23 : T_ACS52
    port Map(bmet0,bmet3,pmet(46),pmet(47),
        over_flag(23),decision_a(23),decision_b(23),smet(23),smet(55));
PE24 : T_ACS52
    port Map(bmet1,bmet2,pmet(48),pmet(49),
        over_flag(24),decision_a(24),decision_b(24),smet(24),smet(56));
PE25 : T_ACS52
    port Map(bmet0,bmet3,pmet(50),pmet(51),
        over_flag(25),decision_a(25),decision_b(25),smet(25),smet(57));
PE26 : T_ACS52
    port Map(bmet1,bmet2,pmet(52),pmet(53),
        over_flag(26),decision_a(26),decision_b(26),smet(26),smet(58));
```

```
PE27 : T_ACS52
    port Map(bmet0,bmet3,pmet(54),pmet(55),
        over_flag(27),decision_a(27),decision_b(27),smet(27),smet(59));
PE28 : T_ACS52
    port Map(bmet2,bmet1,pmet(56),pmet(57),
        over_flag(28),decision_a(28),decision_b(28),smet(28),smet(60));
PE29 : T_ACS52
    port Map(bmet3,bmet0,pmet(58),pmet(59),
        over_flag(29),decision_a(29),decision_b(29),smet(29),smet(61));
PE30 : T_ACS52
    port Map(bmet2,bmet1,pmet(60),pmet(61),
        over_flag(30),decision_a(30),decision_b(30),smet(30),smet(62));
PE31 : T_ACS52
    port Map(bmet3,bmet0,pmet(62),pmet(63),
        over_flag(31),decision_a(31),decision_b(31),smet(31),smet(63));
--end process;      ---End of PE_ASSIGN
```

In the above program, T_ACS52 represents a designation of the processing elements when designing ASIC, and pmet and smet represent the path metric and the state metric, respectively. The state metric smet for the corresponding state, is calculated and outputted by the processing element of the ACS processor. At the next clock, of the two output state metrics, one is fed back to the same processing element and other is inputted to other corresponding processing element as a path metric pmet. For example, one of the state metrics outputted from a 0th processing element PE0 is fed back as one of two path metric inputs to the 0th processing element PE0, and the other state metric is inputted as one of two path metric inputs to a 16th processing element PE16. Further, one of two state metrics outputted from a first processing element PE1 is inputted as one of two path metric inputs to the 0th processing element PE0, and the other output state metric is inputted as one of two path metric inputs to a 16th processing element PE16. Likewise, the rest processing elements PE2–PE31 are connected to each other as described above.

In the processing elements in the above program, PE0, PE2, PE12, PE14, PE21, PE23, PE27, and PE29 commonly use (bmet0, bmet3) as the branch metrics. The processing elements PE1, PE3, PE13, PE15, PE20, PE22, PE24, and PE26 commonly use (bmet1, bmet2) as the branch metrics. The processing elements PE4, PE6, PE8, PE10, PE17, PE19, PE29, and PE31 use (bmet3, bmet0) as the branch metrics. The processing elements PE5, PE7, PE9, PE11, PE16, PE18, PE28, and PE30 use (bmet2, bmet1) as the branch metrics. Namely, the states 0, 2, 12, 14, 21, 23, 27, 29, 32, 34, 44, 46, 53, 55, 57, and 59 use (bmet0, bmet3), the states 1, 3, 13, 15, 20, 22, 24, 26, 33, 35, 45, 47, 52, 64, 56, and 58 use (bmet1, bmet2), the states 4, 6, 8, 10, 17, 19, 29, 31, 36, 38, 40, 42, 49, 51, 61, and 63 use (bmet3, bmet0), and the states 5, 7, 9, 11, 16, 18, 28, 30, 37, 39, 41, 43, 48, 50, 60 and 62 use (bmet2, bmet1).

In the ACS processor of the present invention, the grouping unit 410 determines the group unit according to the highest operation speed of the system and a characteristic of the ASIC cell library. For example, assuming that the ASIC cell library has a chip size of 0.5 micron and the highest operation speed is more than 80 MHz, the grouping unit 410 groups each of the eight processing elements from PE0 to PE31 using (bmet0, bmet3), (bmet1, bmet2), (bmet3, bmet0), and (bmet2, bmet1), respectively, into four groups. Hence, the total of 32 processing elements are grouped into four groups of eight processing elements. Next, the eight processing elements in a same group are separated into units of two processing elements, such as the two processing elements PE0 and PE2 of the group utilizing the branch metrics (bmet0, bmet3) comprise to make up one unit out of four units in the group.

The multiplexer 420 receives the path metrics from the processing elements of 2 units grouped in the grouping unit 410, namely four 6-bits path metrics PA0, PA1, PB0, PB1, and selectively outputs PA0 and PA1, or PB0 and PB1 according to the clock signal CLK. Here, the clock signal CLK provided from the controller 460 operates as the selection signal of the multiplexer 420. Namely, the path metrics PA0 and PA1 are selected to be outputted to the processing element 430 when the clock signal CLK is "high" logical level, whereas the path metrics PB0 and PB1 are selected when the clock signal CLK is "low" logical level.

Figure 2:
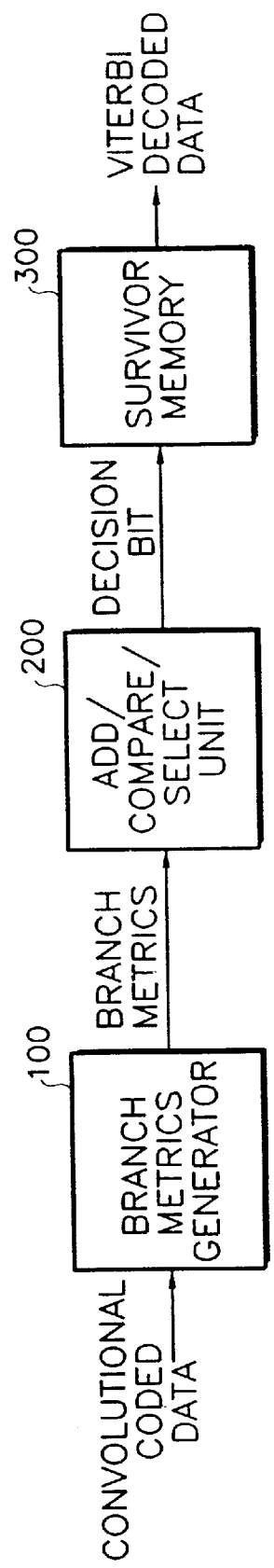
FIG. 2 is a block diagram illustrating a conventional Viterbi decoder.

The processing element 430 receives the path metrics $\gamma_X$, $\gamma_Y$=PA0, PA1 or PB0, PB1 selected in the multiplexer 420 and the branch metrics $\lambda_X$, $\lambda_Y$ from the branch metric generator 100 of FIG. 2, and outputs two decision bits, namely the first and second decision bits, and two state metrics. In the processing element 430, since the two states using the same state metric are processed, two result values are generated. Namely, the path metric $\gamma_X$ and the branch metric $\lambda_X$ are added to output a first added value, and the path metric $\gamma_Y$ and the branch metric $\lambda_Y$ are added to output a second added value. In addition, the path metric $\gamma_X$ and the branch metric $\lambda_Y$ are added to output a third added value, and the path metric $\gamma_Y$ and the branch metric $\lambda_X$ are added to output a fourth added value. After the first, second, third, and fourth added values are compared, respectively, the first and second decision bits are outputted as "0" or "1" according to the compared results. The first or second decision bit is used to select one of two added values, and the selected value is outputted as a state metric.

The first demultiplexer 440 receives the first and second decision bits obtained in the processing element 430, performs a demultiplexing according to the clock signal CLK to output four decision bits DA0, DA1, DB0, and DB1. Namely, the first and second decision bits are outputted as DA0 and DA1 when the clock signal CLK is "high" logical level, whereas the first and second decision bits are outputted as DB0 and DB1 when the clock signal CLK is "low" logical level. At this time, the four decision bits DA0, DA1, DB0, and DB1, outputted in one clock period, are stored in the survivor memory 300 of FIG. 2. The survivor memory 300 recovers the original information sequences by using the decision bits.

The second demultiplexer 450 receives the first and second state metrics obtained in the processing element 430, performs a demultiplexing according to the clock signal CLK to output four state metrics SA, SA1, SB0, and SB1. Namely, the first and second state metrics are outputted as SA0 and SA1 when the clock signal CLK is "high" logical level, whereas the first and second state metrics are outputted as SB0 and SB1 when the clock signal CLK is "low" logical level. At this time, the four state metrics SA0, SA1, SB0, and SB1, outputted in one clock period, are provided to the corresponding processing elements.

The controller 460 generates and outputs the clock signal CLK for controlling the operations of the multiplexer 420, the first demultiplexer 440, and the second demultiplexer 450. Here, the number of operation in one period of the clock signal CLK is set as 2, however, it can be set higher than 4 when using a smaller ASIC cell library or operating at frequency less than 80 MHz of European Digital Video Broadcasting Standard.

In the prior art, for the 64 states, the two states using the same state metric are processed in one processing element, and 32 processing elements are required. However, in accordance with the present invention, since the processing elements using the same branch metrics for 32 processing elements using the same state metrics are merged, only 16 processing elements are required. Accordingly, the size of the hardware can be decreases by 50%. This decrease in size is not only attributed by the decreased number of processing elements, but also by branch metric sharing in the processing elements which decreases a connection area in the ASIC.

As described above, for N number of states, N/2 number of processing elements using the same state metrics grouped into the processing elements of L number of units using the same branch metrics such that only N/2L number of processing elements are required, significantly decreasing the size of the hardware in ASIC.

While this invention has been described in connection with what is presently considered to be the most practical and preferred embodiments, it is to be understood that the invention is not limited to the disclosed embodiment, but, on the contrary, it is intended to cover various modifications and equivalent arrangements included within the spirit and scope of the appended claims.

What is claimed is:

1. An add/compare/select (ACS) processor in a Viterbi decoder for performing maximum likelihood decoding of convolutional codes, comprising:

N number of processing elements for receiving two path metrics and two branch metrics, comparing each added values, and outputting two decision bits and two state metrics according to the compared result;

a grouping unit for grouping said N number of processing elements for corresponding N number of states into processing elements of K number of units using same state metrics and same branch metrics;

a multiplexer for multiplexing L (L=2K) number of path metrics provided from the grouped result into two path metrics according to a predetermined clock signal, and outputting them to a corresponding processing element of said N number of processing elements;

a first demultiplexer for receiving two decision bits obtained from the corresponding processing element, and demultiplexing them into L number of decision bits according to the clock signal; and a second demultiplexer for receiving two state metrics obtained from the corresponding processing element, and demultiplexing them into L number of state metrics according to the clock signal.

2. The ACS processor of claim 1, further comprising a controller for generating the clock signal, and controlling the number of operation of said multiplexer, said first demultiplexer, and said second demultiplexer in one clock period.

3. The ACS processor of claim 1, wherein, in case of 64 states, each of said K number of unit comprises two processing elements for processing four states.

4. The ACS processor of claim 1, wherein said multiplexer performs a multiplexing according to "high" logical level and "low" logical level in one clock period of the clock signal.

5. The ACS processor of claim 1, wherein said first and second demultiplexers perform a demultiplexing according to "high" logical level and "low" logical level in one clock period of the clock signal.

* * * * *